US012131875B2

(12) United States Patent
Siu et al.

(10) Patent No.: US 12,131,875 B2
(45) Date of Patent: Oct. 29, 2024

(54) KEYBOARD ASSEMBLY WITH INTERCHANGEABLE KEYS AND METHOD OF OPERATING THE SAME

(71) Applicant: Home Control Singapore PTE LTD, Singapore (SG)

(72) Inventors: Kwok Hoong Siu, Singapore (SG); Joseph Pok Yap Chong, Singapore (SG); Ching Guan Tay, Singapore (SG); Chen Wee Cheah, Singapore (SG)

(73) Assignee: Home Control Singapore PTE LTD, Singapore (SG)

( * ) Notice: Subject to any disclaimer, the term of this patent is extended or adjusted under 35 U.S.C. 154(b) by 0 days.

(21) Appl. No.: 18/257,288

(22) PCT Filed: Dec. 9, 2021

(86) PCT No.: PCT/SG2021/050773
§ 371 (c)(1),
(2) Date: Jun. 15, 2023

(87) PCT Pub. No.: WO2023/106998
PCT Pub. Date: Jun. 15, 2023

(65) Prior Publication Data
US 2024/0013991 A1 Jan. 11, 2024

(51) Int. Cl.
*H01H 13/70* (2006.01)
*G06F 3/02* (2006.01)
(Continued)

(52) U.S. Cl.
CPC ........... *H01H 13/70* (2013.01); *G06F 3/0202* (2013.01); *G06F 3/0238* (2013.01); *H01H 13/14* (2013.01);
(Continued)

(58) Field of Classification Search
CPC ...... H01H 13/70; H01H 13/14; G06F 3/0202; G06F 3/0238; H04N 21/42212; H04N 21/42227; H05K 1/181; H05K 2201/10053
(Continued)

(56) References Cited

U.S. PATENT DOCUMENTS

| 5,729,222 A | 3/1998 | Iggulden et al. |
| 8,058,571 B2 * | 11/2011 | Rajagopal ............ H01H 13/503 200/341 |
| 2003/0095048 A1 | 5/2003 | Choi et al. |

FOREIGN PATENT DOCUMENTS

| CN | 104680760 A | 6/2015 |
| CN | 104766742 A | 7/2015 |

OTHER PUBLICATIONS

International Preliminary Report on Patentability mailed Oct. 25, 2022 for PCT Application No. PCT/SG2021/050773, filed Dec. 9, 2021.

\* cited by examiner

*Primary Examiner* — Lheiren Mae A Caroc
(74) *Attorney, Agent, or Firm* — Knobbe, Martens, Olson & Bear, LLP

(57) ABSTRACT

There is a keyboard assembly for a handheld device, including a housing having a first section and a second section. The keyboard assembly has a plurality of slots formed on the first section. A printed circuit board (PCB) is disposed between the first and second sections. A key mat is sandwiched between the first section and the PCB, the key mat having a plurality of fixed keys and a plurality of interchangeable keys, each key protruding from the key's corresponding slot on the first section. Each interchangeable key has a unique identity, such that when each interchangeable key is replaced (Continued)

onto another slot on the first section, the interchangeable key's unique identity remains with the interchangeable key.

14 Claims, 8 Drawing Sheets

(51) Int. Cl.
    *G06F 3/023*     (2006.01)
    *H01H 13/14*     (2006.01)
    *H04N 21/422*     (2011.01)
    *H05K 1/18*     (2006.01)

(52) U.S. Cl.
    CPC . *H04N 21/42212* (2013.01); *H04N 21/42227* (2013.01); *H05K 1/181* (2013.01); *H05K 2201/10053* (2013.01)

(58) Field of Classification Search
    USPC .............................................. 200/281, 42.02
    See application file for complete search history.

KEYBOARD ASSEMBLY WITH INTERCHANGEABLE KEYS AND METHOD OF OPERATING THE SAME

This application is a U.S. national stage application of PCT Patent Application No. PCT/SG2021/050773, filed Dec. 9, 2021, which is incorporated by reference in its entirety.

TECHNICAL FIELD

The present invention relates to a keyboard assembly with interchangeable keys and a handheld device comprising the keyboard assembly and a method of operating the same.

BACKGROUND

The following discussion of the background is intended to facilitate an understanding of the present disclosure only. It should be appreciated that the discussion is not an acknowledgement or admission that any of the material referred to was published, known or is part of the common general knowledge of the person skilled in the art in any jurisdiction as of the priority date of the invention.

The advent of broadband internet connectivity has led to the development of "streaming" media services that can provide on-demand content—such as movies, TV shows, music and games to a consumer's media system. In recent years, online streaming services, for example, Netflix, Amazon Prime Video, Disney Plus, HBO Max, and others, have become popular with media consumers. Consumers often subscribe to one or more online streaming services at the same time. Modern media systems (e.g., smart TVs) provide a menu that may include menu icons that allow a user to launch a streaming service application such as Netflix by navigating and clicking respective menu icons with a remote control device included with media systems. With more than one subscription to streaming services, a user would have to navigate the menu on screen to find his or her preferred streaming service applications.

In recent years, there are more commercially available media systems that provide streaming services with remote control devices that have one or more pre-labelled shortcut buttons or keys that each corresponds to an online streaming service application. These shortcut buttons provide flexibility and convenience for a user to enjoy his or her preferred streaming services with a click of button, without having to navigate an on screen menu. However, due to the form factor, there is a limit to the number of shortcut buttons that may be included in a remote control device before the button arrangement becomes complicated and not ergonomic. There are typically two or four shortcut buttons depending on the form factor of the remote control device. The shortcut buttons are generally pre-labelled according to a media system provider's preference. Often, these pre-labelled shortcut buttons may not include all of the user's preferred streaming services. The user would have to navigate the media system's menu on screen to find his or her streaming service that is not included with the shortcut buttons. Additionally, a user does not have the flexibility to rearrange these buttons according to his/her preference or replace them with different ones that provide shortcuts to the user's preferred streaming service. This can lead to frustration for the user.

As stated above, the shortcut buttons are pre-assigned or pre-labelled based on the preference of the media system providers. The preference may be based on their negotiations and agreements with streaming service providers or vendors and/or services that will likely lead to increased average revenue per user (ARPU). Media system providers may discuss details in great length with remote control device vendors on the button arrangement, functionalities and fixing the pre-labelled shortcut buttons before making the mold for the remote control device's housing and button assembly. If there are any changes thereafter, the media system provider usually would have to accept only printing on the button label. As it will be appreciated, any changes to button arrangement such as adding or removing buttons may involve modification to the mold, which will incur additional cost and delay production of the remote control devices. This can be a major business disadvantage to the media system provider. Additionally, the media system provider does not have the flexibility to change pre-labelled shortcut buttons which becomes outdated, for example, a streaming service is no longer in preference or goes out of business.

Shortcut buttons may also be used to provide convenience to a user by effecting a multistep function of the media system such as setting up the control functionalities of multiple devices or powering on or off multiple devices consecutively in the media system.

There exists a need for a device to alleviate one or more of the aforementioned problems. A further object of the invention is to provide a more flexible means to allow a user to change a button arrangement and/or to change pre-labelled shortcut buttons to their preferred streaming services. Furthermore, it is also desirable to provide media system providers with a business advantage with flexibility to configure button arrangement; such as changing shortcut buttons for streaming service provider or vendors, or introducing new function to enhance user's viewing experience and others, even after the remote control device is manufactured.

Various ways of providing interchangeable buttons or keys on remote control device have been contemplated. There is a known method of using label stickers to be placed over the buttons or adjacent to the buttons and utilizing software programming to assign a different function to the buttons to correspond with the label stickers. However, software programming may be a complicated process for some users and the label sticker may come off once the adhesives become worn.

There is also a known method which includes providing programmable shortcut buttons with generic or non-descriptive labels, such as numeric digits or letters. However, a user would have to remember the function of each programmable button since the generic or non-descriptive labels do not provide any information about each button's functionality. This can be a larger problem especially when the remote control device is shared by multiple users.

There is also a known remote control device with configurable buttons. Embedded inside each configurable button is a RFID chip or electrical components configured to correspond to the button label. Each button has receptacles to conduct electrical signal to identify the button from the RFID chip or the electrical elements when the inserted button is pressed. However, the electrical signal may be degraded or corrupted over time when the receptables deteriorate exacerbated by dust, oxidation or wear from the button press. There also may be little tactile feel of the button when the button is pressed in such remote control devices. Furthermore, it may not be economical having a RFID chip embedded in each button and the necessity of embedding RFID chip or electrical elements into each button may be expensive and labour intensive.

SUMMARY

The disclosure was conceptualised to provide a keyboard assembly for a handheld device, such as a remote control device, with interchangeable keys that can be customized to a user's preference.

In an aspect there is a keyboard assembly for a handheld device, comprising a housing having a first section and a second section; a plurality of slots formed on the first section; a printed circuit board (PCB) disposed between the first and second sections; a key mat sandwiched between the first section and the PCB, the key mat having a plurality of fixed keys and a plurality of interchangeable keys, each key protruding from its corresponding slot on the first section, wherein the plurality of interchangeable keys, each has an identification means configured to provide each interchangeable key with a unique identity, such that when each interchangeable key is replaced onto another slot on the first section, its unique identity remains with the interchangeable key.

In some embodiments, the identification means is a plurality of pins extending from each interchangeable key towards the PCB.

In some embodiments, the plurality of pins is configured to be selectively coated with a conductive material.

In some embodiments, the key mat comprises a plurality of adapters, each adapter being sized and shaped to receive a corresponding interchangeable key.

In some embodiments, each of the interchangeable key comprises a key cover and a key base.

In some embodiments, the key cover has a plurality of key cover pins extending from a lower surface of the key cover.

In some embodiments, the key base has a plurality of sleeves extending from a lower surface of the key base, each of the sleeves having a sleeve hole therein and adapted to receive the corresponding key cover pins.

In some embodiments, the sleeves are selectively coated with conductive print to identify each interchangeable key.

In some embodiments, the key cover has a slit at an edge of the key cover.

In some embodiments, the key mat has a protrusion formed on a lower side of the key mat at a location of the interchangeable key, the protrusion being configured to abut a dome shaped element disposed on the PCB, when the interchangeable key is actuated by a user.

In some embodiments, the keyboard assembly further comprising a plurality of contact nodes disposed on the PCB and aligned under a base of each sleeve, the sleeves being configured to contact the plurality of contact nodes when the interchangeable key is pressed.

In some embodiments, the plurality of contact nodes is disposed on the PCB and under the dome shaped element.

In some embodiments, the key cover pin is arranged such that there is a gap between a tip of the key cover pin and a base of the sleeve.

According to another aspect of the disclosure, there is a handheld device comprising the keyboard assembly.

According to another aspect of the disclosure, there is a method of operating the handheld device comprising the keyboard assembly. The method comprises the steps of: replacing an interchangeable key with another preferred interchangeable key on the handheld device to form a newly assembly interchangeable key; pressing the newly assembled interchangeable key, such that a unique identity of the interchangeable key is detected by the combination of a plurality of contact nodes and pins; assigning a code from a correlation database to the newly assembled interchangeable key; assigning a corresponding command code from a command code library to each code; and transmitting the command code to a media device.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present disclosure.

DESCRIPTION OF EMBODIMENTS

The disclosure was conceptualized to provide a device which will allow a user or a media system provider to customize the arrangement of the keys of a remote control device by changing pre-labelled keys according to preference, or replacing them entirely with different ones.

In order to illustrate the technical solution(s) to the embodiments of the present disclosure, embodiments of the present disclosure are described with reference to the drawings. It is appreciable that the drawings referred to are some examples or embodiments of the present disclosure. A person having ordinary skill in the art, without further creative efforts, may apply the present disclosure to other scenarios according to these drawings. For example, although the embodiments are described with respect to the example of a hand held device such as a remote control device in a streaming media environment, these embodiments are applicable to the control of any electronic devices in any environment, for example, keyboard for user input into a data processing system, video game controller, keypad or integrated control buttons on a device; in any type environment for example information, multimedia or entertainment system.

Figure 1:
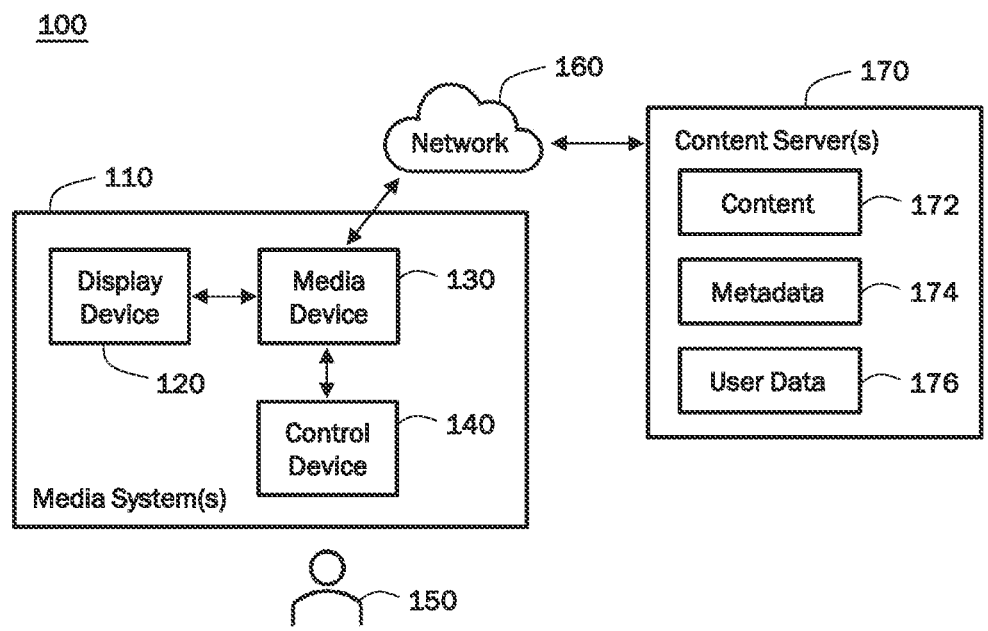
FIG. 1 is a diagram of an exemplary multimedia environment where embodiments of the present invention may be implemented.

FIG. 1 is a diagram of an exemplary multimedia environment where embodiments of the present invention may be implemented. In a non-limiting example, multimedia environment 100 is an on-demand streaming media content environment. Multimedia environment 100 may include one or more media systems 110. Media system 110 may include a display device 120, a media device 130 and a control device 140. Display device 120 may be, for example, a television, a monitor or a projector. Media device 130 may be, for example, a streaming media, player, a streaming stick, a cable or satellite set-top box. The media device 130 may be preloaded with streaming content service applications from different streaming service providers or vendors for example HBO Max, Netflix, and Amazon Prime Video. The media device 130 and display device 120 may be bunt into a single device (e.g., smart television).

The media device 130 may be integrated with or operatively connected to theft respective display device 120, control device 140, and/or network 160. The media device 130 may aurally and/or graphically present user interface (UI) views, UI elements (e.g., menu and icons) and/or content onto display device. A streaming service application executing on a media device 130 may communicate with one or more content servers 170 via network 160 to request and receive streaming services or contents to be displayed on display device 120. Network 160 may include, for example, without limitation, wired and/or wireless intranet, extranet, Internet, cellular, fibre, coaxial, Ethernet, ° i-Fi, Bluetooth and/or any other short range, long range, local, regional global communication networks, as well as any combination thereof.

Content servers 170 may each include, for example, without limitation, databases to store content 172, metadata 174 and user data 176. Content 172 may include any combination of video, movies, programs, music, images, multimedia, gaming applications, advertisement, software application, etc. Metadata 174 may include information about the content 172. For example, metadata 174 may include associated information related to director, actor, artist, summary, trailers, genre, etc., pertaining to the content 172. User data 176 may include customer specific information such as user profile information, subscription, user login, preferences, usage history, etc.

A user 150 may interact with media system 110 using control device 140 to enjoy the content. For example, the user may launch his or her subscribed streaming service such as Netflix by navigating and clicking respective menu icon displayed on display device 120 with control device 140. The media device 130 may, upon receiving signal from the control device 140, send a command to the network 160 to request content from the content servers 170 to be delivered to the media system 110 to be consumed by user, in a preferred embodiment, control device 140 may include a number of pre-labelled shortcut keys that each corresponds to an online streaming service (e.g., Netflix)). These shortcut keys provide both flexibility and convenience for a user to enjoy his or her preferred streaming services with a click of a button.

Figure 2:
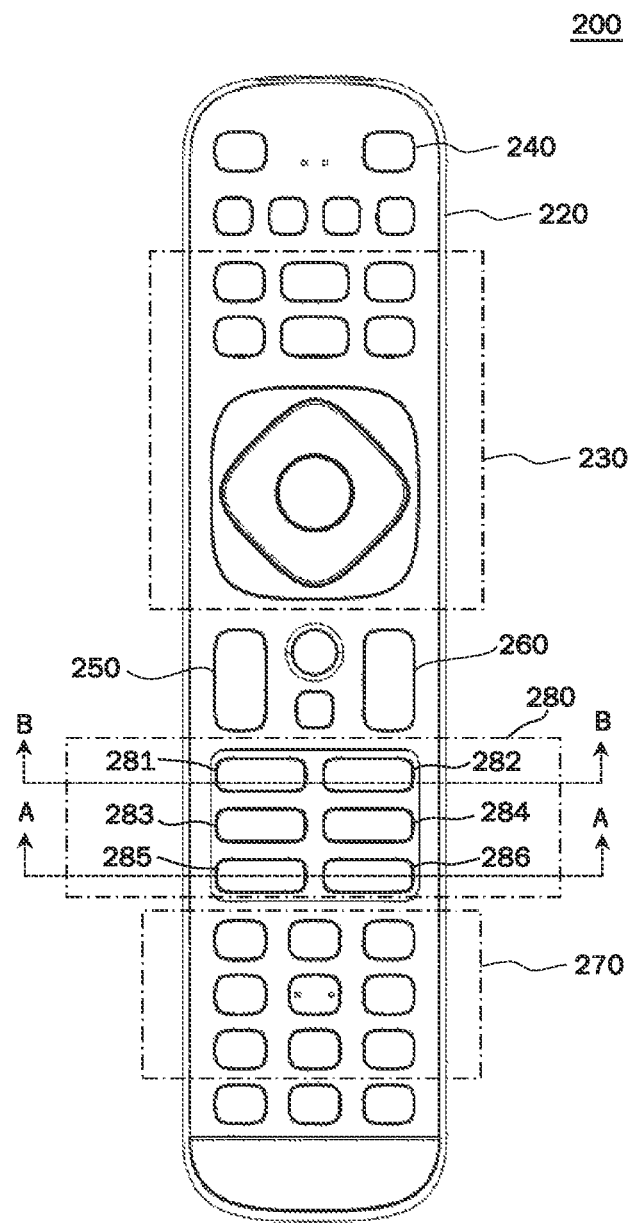
FIG. 2 is a top view of a handheld device such as a remote control device comprising a keyboard assembly.

FIG. 2 is a top view of a handheld device such as a remote control device comprising a keyboard assembly. In some embodiments, device 200 is an implementation of the control device 140 of the media system 110 of FIG. 1. The control device, such as remote control device 220 may generally include a plurality of standard navigation keys 230 such as four directional keys and "OK" key, "BACK" key, "HOME" key and "MENU" key, to name a few examples. The remote control device 220 may also generally be provided with a power key 240. In some embodiments, additional keys may be included in the remote control device 220, depending on the design choice of the media system provider. For example, cable television/internet providers may prefer to have additional keys such as volume key 250, channel key 260 and digit keys 270 for direct entry and numeric response to queries when so required.

It is desirable to provide the remote control device 220 with a plurality of shortcut keys for allowing a user to directly access different screen pages, functions, and activities quickly. Preferably, the remote control device 220 is provided with, "streaming content service" key cluster 280 for allowing the user to directly access preferred streaming content service applications. These shortcut keys in the cluster are usually in the number of two or four, depending on the form factor of the device 200. In a non-limiting example, the remote control device 220 includes a cluster of six streaming content service keys 281, 282, 283, 284, 285, 286, which may be pre-labelled with services such as Netflix, Amazon Prime Video, Disney Plus, HBO Max, Hulu, and YouTube Premium, and others, according to the preference of media system providers. In some embodiments, the shortcut keys may be pre-labelled with television channels such as ESPN, FOX, NBC, CNN, and others.

In a preferred embodiment, the pre-labelled streaming content service keys cluster 280 are interchangeable and customizable to adapt to the changing landscape of streaming content services. For example, new streaming content services may be introduced by vendors while some may be become less popular or go out of business, or a user may change preference or change service subscription. The interchangeable streaming content service keys cluster 280 will be described in detail below, with reference to FIGS. 3-5.

Figure 3:
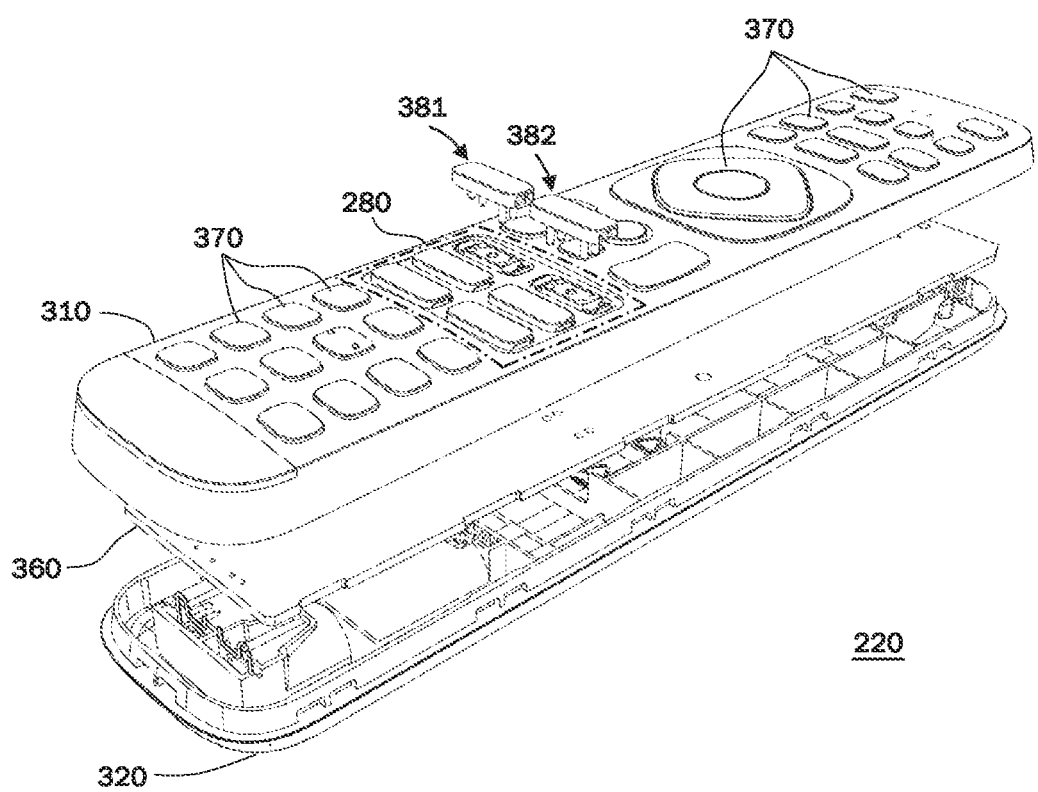
FIG. 3 is an exploded perspective view showing major constituent parts of the remote control device of FIG. 2 according to an exemplary embodiment of the present invention.

FIG. 3 is an exploded perspective view showing major constituent parts of the remote control device of FIG. 2 according to an exemplary embodiment of the present invention. Each of the interchangeable streaming content service keys cluster 280 has a hard plastic key cap assembly that provides a top contact surface with a solid feel to user. Only exploded perspective views of key cover assemblies 381 and 382 of content service keys 281 and 282 are shown, in order not to obscure the drawing.

The remote control device 220 comprises a housing with a first section 310 and a second section 320, which, when assembled, forms a cavity to house internal parts. The internal parts may include a printed circuit board (PCB) 360. The PCB 360 may have electronic circuitry (not shown) and one or more electrically conductive layers (not shown). The electronic circuitry may include a processor coupled to a memory system, a wireless transceiver, a power supply regulator, etc., to control the operation of the remote control device 220 (described in more detail in FIG. 9).

The first section 310 is configured to accommodate a user interface of the remote control device 220. The user interface has a key mat 330 (more detail in FIG. 6) for a plurality of individually operable keys 370 that the user can press in operational use of the remote control device 220. In the embodiment shown in FIG. 3, the operable keys 370 are configured to be fixed (i.e. not interchangeable). The term "key mat" is shown in FIG. 3 to be a visible part of the set of pressable keys in the user interface of the remote control device 220, for example navigation keys 230, volume key 250, channel key 260 and digit keys 270, as shown in FIG. 2. The key mat 330 is preferably made of a soft elastomeric material such as silicone rubber. The first section can include slots 450, as shown in FIG. 4.

Figure 4:
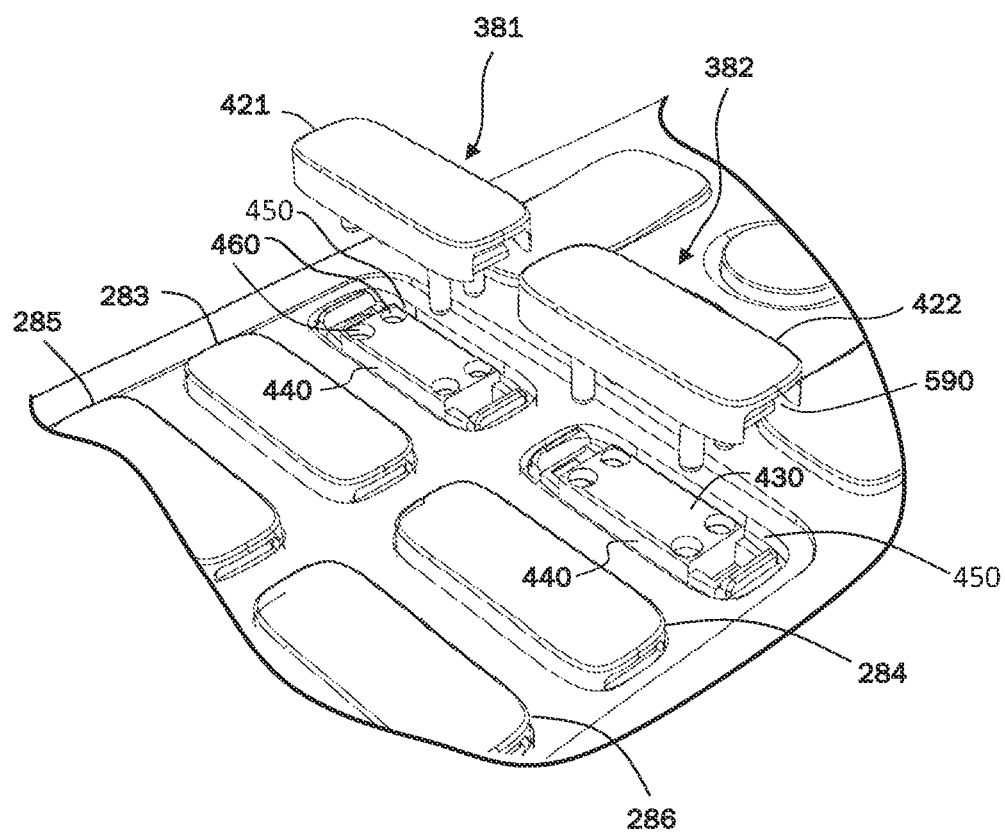
FIG. 4 is an enlarged view of a cluster of interchangeable keys, including an exploded perspective view of the interchangeable keys.

FIG. 4 is an enlarged view of a cluster of interchangeable keys, including an exploded perspective view of the interchangeable keys. The interchangeable streaming content service keys cluster 280 preferably comprises a plurality of key cap adapters 440 disposed on the key mat 330 (more detail in FIG. 6). The key cap adapter 440 may be supported and bonded on the key mat 330. The bonding of the key cap adapter 440 to the key mat 330 may be made with adhesive or made in a two-shot injection molding process. Two-shot injection molding processes are known in the art. A two-shot injection molding process is based on a difference in the melting points of two different thermoplastic resins, in this case, the plastic key cap adapter and rubber key mat.

A key cap assembly 381 comprises a key cap top 421 and a key cap adapter 440, which when assembled, forms the interchangeable streaming content service keys 281. Likewise, the key cap assembly 382 comprises a key cap top 422 and a key cap adapter 440, which when assembled, forms the interchangeable streaming content service keys 282.

The key cap adapter 440 and key cap top 421 may have similarly sized edges, which, when assembled, are in contact with one another. Likewise, for key top 422 and other key tops for streaming keys 283, 284, 285 to 286 for that matter. The key cap adapter 440 may be shaped with recesses and holes to accommodate the key cap top 421. An upper face 430 of key cap adapter 440 may have multiple through-holes 460 which are configured to accommodate an array of pins 580 protruding from a lower face of the key cap top 421.

In some embodiments, the key cap top 421 and key cap adapter 440 may be further secured with one or more fasteners, for example, by a locking hook, such that the key cap top 421 cannot be dislodged easily or be removed easily by a child. Preferably, the key cap top 421 has a slit 590 on the side of the key cover for insertion of a suitable tool, such as a screwdriver, to remove the key cap assembly 381 from the remote control device 220.

Figure 5A:
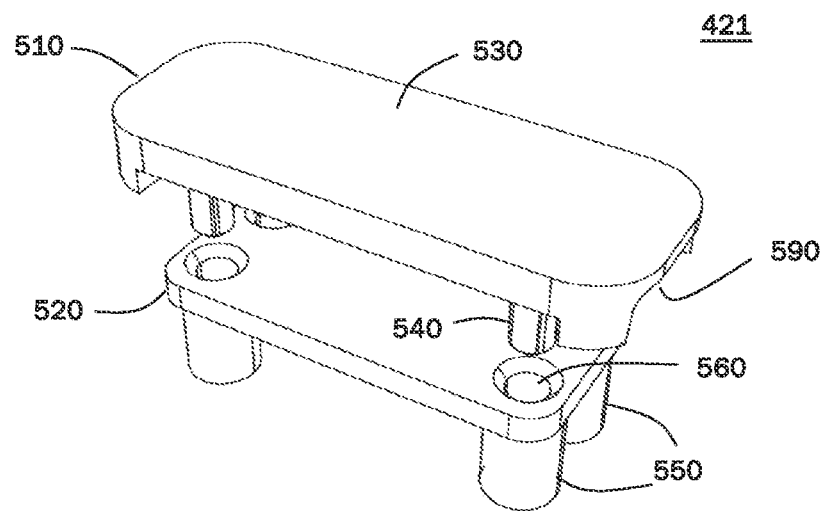
FIGS. 5A and 5B is an exploded perspective view showing the key cover and key base viewed from the top and bottom respectively.
Figure 5B:
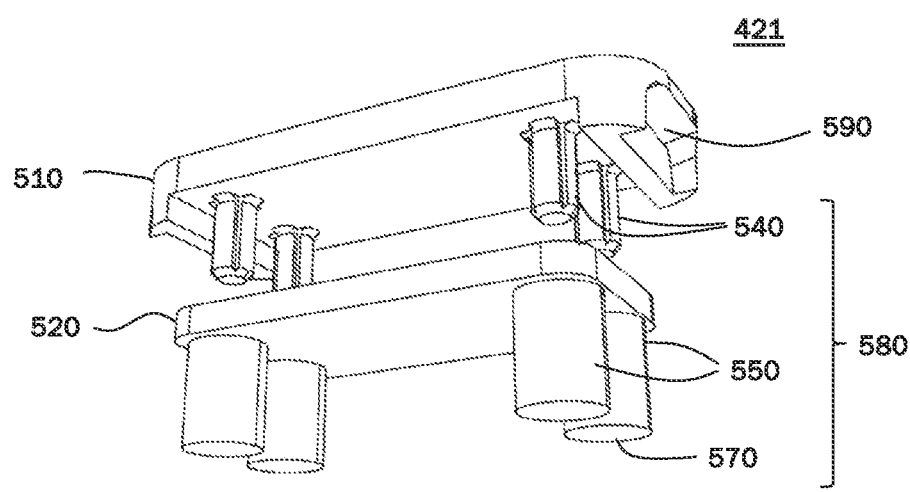

FIGS. 5A and 5B is an exploded perspective view showing the key cover and key base viewed from the top and bottom respectively. The key cap top 421 comprises a key cap cover 510 and key cap base 520, which when assembled, forms the key cap top 421. The key cap cover 510 as part of key cap top 421 is preferably made of a hard plastic that provides a top contact surface with a solid feel to user. The key cap base 520 is preferably made of a soft elastomeric material such as silicone rubber. The key cap top 421 has an upper face 530 which may preferably be pre-labelled with a name, an image or a logo of an online streaming content service or vendor. In some embodiments, it may be pre-labelled with an image denoting a function or command such as setup, play, pause, fast forward, etc.

A lower face of key cap cover 510 may have one or more key cap pins 540 which extends downwards towards the PCB. In a preferred embodiment, each key cap cover 510 may have four key cap pins 540. A lower face of the key cap base 520 may have one of more sleeves 550 with a sleeve hole 560 disposed on an upper face of key cap base 520 to accommodate the key cap pin 540. Each key cap pin 540 may be configured to be inserted into a corresponding sleeve hole 560 in the key cap base 520. The key cap pin 540 may preferably be cylindrically shaped. A free end or a tip of the pin 540 may preferably be slightly rounded or be provided with a bevel edge to facilitate the insertion of pins 540 into the sleeve holes 560. A tip or a free end of the sleeve 550 may selectively be coated or printed with electrically conductive print 570 to identify the uniquely pre-labelled key cap top. The key cap pin 540 and sleeve 550 with the selective conductive print 570 at the tip of the sleeve 550, when assembled, forms an array of permutation pins 580 which uniquely identifies the pre-labeled key cap top 421.

Figure 6:
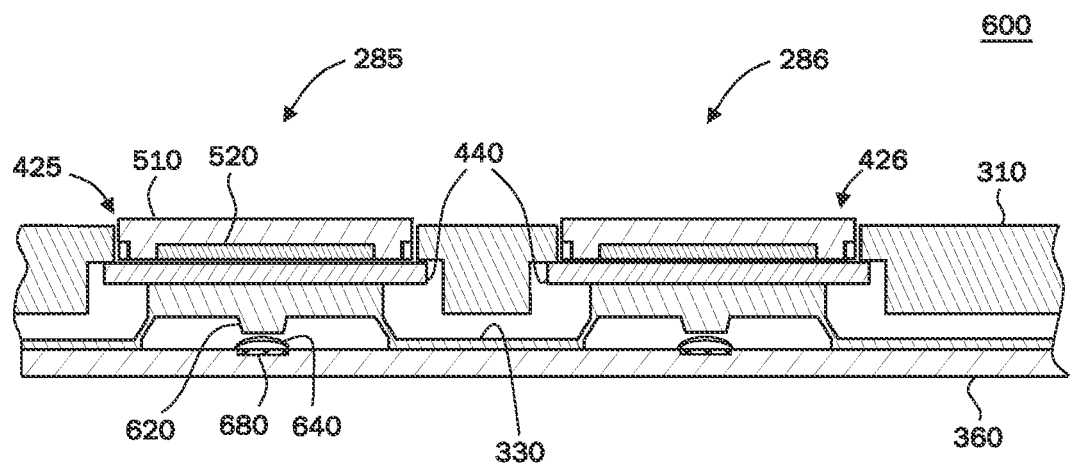
FIG. 6 is a cross-sectional view of two of the exemplary interchangeable keys taken along line A-A of FIG. 2 illustrating the view along the longitudinal center axis of the interchangeable keys.

FIG. 6 is a cross-sectional view of two of the exemplary interchangeable keys taken along line A-A of FIG. 2 illustrating the view along the longitudinal center axis of the interchangeable keys. While different keys may be used to describe the exemplary embodiments of this invention in order not to obscure the drawing, it should be understood that the disclosure is not limited thereto and is applicable to other interchangeable streaming content service keys cluster 280.

The housing of the remote control device 220 comprises the first section 310 and the second section (not shown). The housing is configured to accommodate the PCB 360 and the key mat 330. The key mat 330 may be disposed on an upper surface of the PCB 360. The key mat 330 may preferably be fabricated from a soft elastomeric material such as silicone rubber. The key mat 330 may be molded to form a plurality of individually operable keys 370 that a user can press during an operational use of the remote control device 220, for example navigation keys 230, volume key 250, channel key 260 and digit keys 270, as shown in FIG. 2. The interchangeable streaming content service keys cluster 280 preferably comprises a plurality of plastic key cap adapters 440 disposed on an upper face of the key mat 330. The key cap adapter 440 may be supported and bonded onto the upper face the key mat 330 with suitable adhesives or molded together in a two-shot injection molding process.

Interchangeable keys 285 and 286 respectively have key cap tops 425 and 426 with its upper face uniquely pre-labelled. The key cap top comprises a key cap cover 510 and key cap base 520, which when assembled, forms the key cap top as illustrated in FIGS. 5A and 5B as described above. The key cap top may preferably have a generally rectangular shape with a slightly rounded top surface that follows the surface contour of the remote control device 220.

The key mat 330 may be configured to provide a predetermined, necessary amount of elasticity required to provide a desired amount of tactile feel of the key when the key is pressed. A plurality of plungers 620 are formed on the lower side of the key mat 330 at each individually interchangeable streaming content service keys cluster 280. The PCB 360 may preferably have a plurality of dome shaped structure 640 disposed therein and centered directly below each of plungers 620. Dome shaped structure 640 may preferably be made of stainless steel. The plunger 620 may preferably be of a generally cylindrical shape or a conical shape with flat surface at its tip and is arranged to be disposed with a small gap above each dome shaped structure 640. Hence, when a key is pressed, the plunger 620 moves downward and flexes the domed structure 640, thereby effecting a tactile feel.

Figure 7:
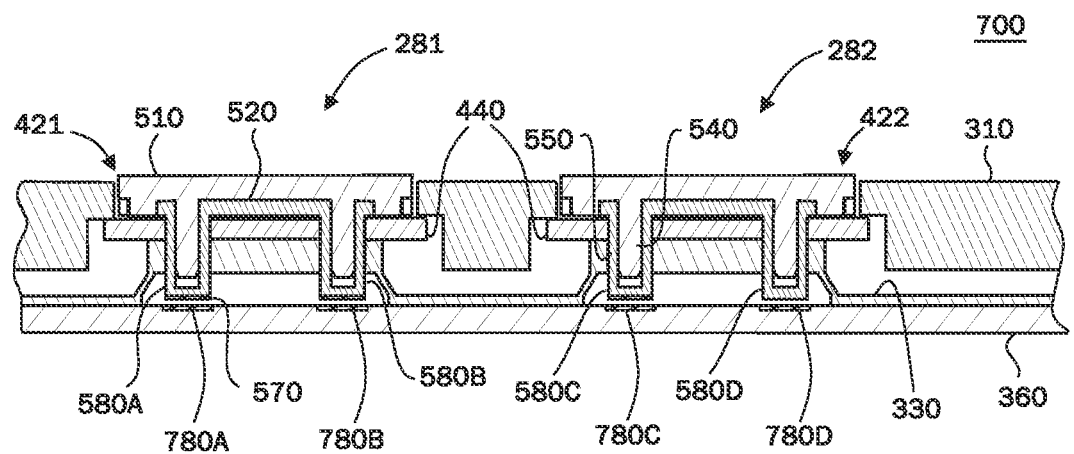
FIG. 7 is a cross-sectional view taken along line B-B of FIG. 2, offset from longitudinal center axis of the interchangeable keys.

FIG. 7 is a cross-sectional view taken along line B-B of FIG. 2, offset from longitudinal center axis of the interchangeable keys. The permutation pin 580 comprising an assembly of key cap pins 540 and sleeves 550 (see also FIG. 5) extends downwardly from the lower face of key cap top 421 and 422 towards the PCB. The number of pins in the array may be dependent on the available area on the interchangeable key to accommodate the pins and the design complexity of the key. In a preferred embodiment, each key may preferably have an array of four permutation pins 580.

The tip of the permutation pins 580, may be selectively coated or printed with electrically conductive print 570 to identify the uniquely pre-labelled key cap top. For example, the tips of permutation pins 580A, 580B and 580C may be coated or printed with the electrically conductive print. The tips of permutation pin 580D is not coated with the electrically conductive print 570. Thus, one or more permutation pins 580 is different for each key cap top. In this non-limiting example, a total of 16 uniquely pre-labelled key cap tops are possible and is invariant for a user to install or interchange any key with suitable adaptive surface at any location on the remote control device 220.

The PCB 360 may preferably have a plurality of electrically conductive contact nodes 780 disposed therein and centered directly below each of the permutation pin 580. When the interchangeable streaming content service key is pressed, the permutation pin 580 moves downward and comes into contact with the contact nodes 780. An electrical contact is thus formed in such a disposition that selective permutation pin with conductive print 570 manipulates the controlling of the "ON/OFF" of the contacts formed by contact nodes 780 therein.

It should be noted that the electrical contact is formed at selective contact nodes while the dome shaped structure 640 is flexed by plunger 620 effecting tactile feel when the key is pressed, as illustrated by FIGS. 6 and 7.

A contact node 680 may be disposed on the PCB 360 centered directly below the dome shaped structure 640 of each of plungers 620, to enhance the detection of each unique identification of the interchangeable key cap top. The length of key cap pin 540 is designed to leave a gap between the tip of the key cap pin 540 and sleeve 550 to further enhance the click feel, as illustrated in FIG. 7.

In this non-limiting example illustrated in FIG. 7, a closed circuit is formed at the contact node due to the conductive print 570, resulting in an "ON" state at 780A, 780B and 780C. At contact node 780D, an open circuit is formed, resulting an "OFF" state since the tip of permutation pin 580D is not coated with conductive print 570.

As an example, the key cap top 421 of interchangeable key 281 may be pre-labelled with Netflix and the key cap top 422 at interchangeable key 282 may be pre-labelled with Disney Plus resulting in the "ON/OFF" states as described above. When key cap tops 421 and 422 are swapped into the location of interchangeable keys 282 and 281 respectively, an "ON" state is established at 780A, 780C and 780D while an "OFF" state is now at 780B. The change in states is detected by a processor (not shown) which interprets that interchangeable key 281 is now labeled with Disney Plus and key 282 is now labeled with Netflix and transmitting the appropriate remote control command is entailed.

Accordingly, the permutation pin 580 with selective conductive print 570 and contact node 780 provide the identification of the interchangeable key caps. In this non-limiting example, four different "ON/OFF" states are communicated to the processor as four binary states by each interchangeable key with uniquely pre-labeled key cap top. More specifically, a unique code can be assigned to represent each uniquely pre-labelled key cap top. In this example, 16 unique codes are available. Each code with corresponding information and functions of the uniquely pre-labelled key cap top may be stored in a correlation data table or database. For example, code 01 may represent Netflix service and its corresponding IR or RF key code to launch the application, code 02 may represent Hulu, etc. Preferably, the correlation database may be provided in a memory system of the remote control device 220. In some embodiments, the correlation database may be provided in the media device 130 as shown in FIG. 1.

The present invention which may be implemented in the manner described above brings about a few advantages. A more flexible means is provided to allow a user to change the key arrangement and/or to change pre-labelled shortcut keys to their favorable streaming services. In addition, media system providers have the business advantage and flexibility to configure key arrangement, including changing shortcut keys for streaming service provider or vendors, which may have become more popular or may have become outdated, on the remote control device even after it is manufactured. Further, cable television/internet providers such as Spectrum, Cox Communications, and others may promote special or commemorative events such as Olympic Games, FIFA World Cup, etc., on channels such as ESPN, FOX, NBC, and others, by providing interchangeable shortcut keys allowing user to access these programs directly with the click of a button.

Another advantage of the present invention is that the permutation pin 580, which is an assembly of key cap pin 540 formed from plastic key cap and sleeve 550 formed from soft elastomeric material, is dimensioned to fit within through hole 460 in the key cap adapter 440. This prevents the "see-saw" effect or "rocking" along the longitudinal center axis of the interchangeable keys cluster 280. The key cap pin provides structural reinforcement for the permutation pin which may be desirable in certain high usage applications with the design of the sleeve to reduce fatigue and to enhance click feel.

Figure 8A:
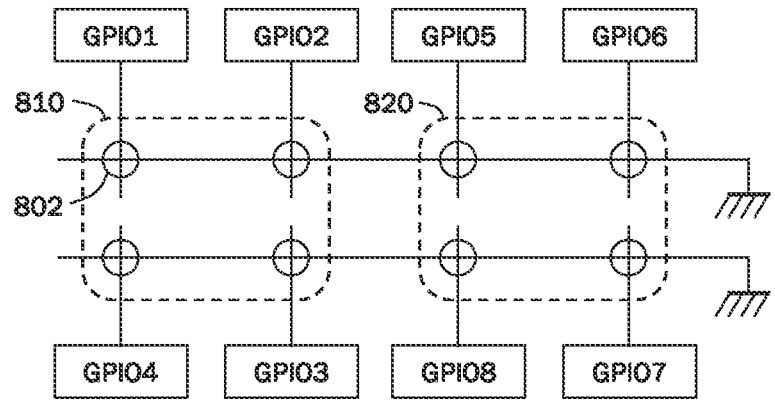
FIGS. 8A and 8B is a schematic diagram showing the arrangement of contact nodes and GPIOs according to the prior art.
Figure 8B:
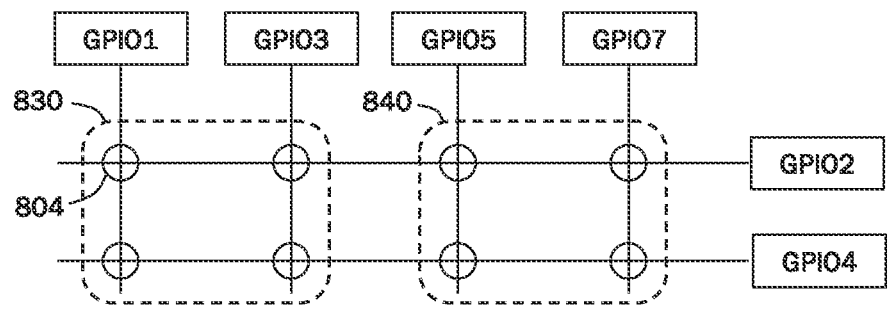
Figure 8C:
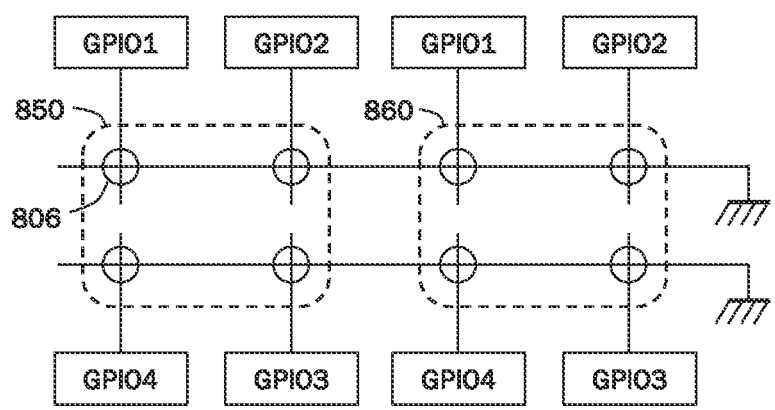
FIG. 8C is a schematic diagram showing the arrangement of contact nodes and GPIOs according to the invention.

FIGS. 8A and 8B is a schematic diagram showing the arrangement of contact nodes and General Purpose Input/Output (GPIOs) according to the prior art, and FIG. 8C is a schematic diagram showing the arrangement of contact nodes and GPIOs according to the invention.

FIG. 8A illustrates keys 810 and 820 each having four (4) contact nodes 802 disposed on the PCB. As described above, the ON/OFF states on the contact nodes 802 is dependent on the permutation pins with selective conductive print. This detection mechanism is disadvantageous as it requires a multiplication product of each contact node and the number of interchangeable keys. In a non-limitation example with six (6) interchangeable keys in this disclosure, twenty-four (24) GPIOs would be required.

FIG. 8B illustrates keys 830 and 840 each having four (4) contact nodes 804 disposed on the PCB. The number of GPIOs required in this mechanism is lesser i.e., ten (10) in total, as compared to mechanism in FIG. 8A. This detection mechanism, however, is disadvantageous as it is prone to "ghost key", whereby the state of fourth contact node is undeterminable if three contact nodes are a closed circuit.

FIG. 8C illustrates another advantage of this invention in that the number of input ports or commonly known as GPIOs required on the processor is independent from the number of interchangeable keys. FIG. 8C, as disclosed in this invention, illustrates keys 850 and 860 each having four (4) contact nodes 806 disposed on the PCB. Each key requires only four (4) GPIOs for detection mechanism and is independent from the number of interchangeable keys. Hence this detection mechanism greatly reduces the constraints imposed on the processor in terms of numbers of GPIOs required.

Figure 9:
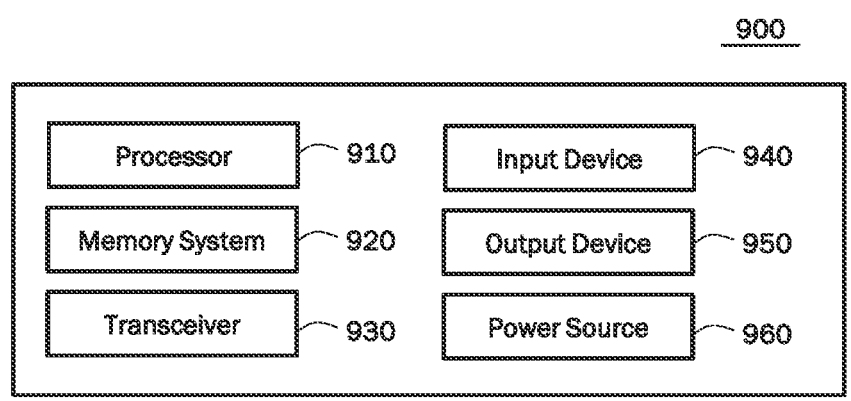
FIG. 9 is a schematic block diagram of a platform for a device having control functionality and exemplary user interface with interchangeable keys.

FIG. 9 is a schematic block diagram of a platform for a device having control functionality and exemplary user interface with interchangeable keys. A platform 900 may be used, for example, to implement the control device 140 in FIG. 1, or method 1000 of FIG. 10 (see below). Various embodiments can be implemented, for example, device 200, using one or more components in platform 900.

The platform 900 preferably includes a processor 910 coupled to a memory system 920, a transceiver 930, an input device 940, an output device 950 and a power source 960. The processor 910, for example CPU, ASIC, FPGA, microcontroller, and the like, may be programmed to control various electronic components within the platform 900, such as monitoring power, interpreting user input, such as key presses, and providing user output, such as visual displays, audible alerts, and causing a transmission and reception of control signals, etc.

An input device 940 may include a key matrix in the form of tactile buttons, touch sensitive buttons or combination of thereof, one or more sensors such as a microphone, a pressure sensor, etc., for receiving an input from a user. In this exemplary platform, one or more tactile buttons may be customizable. Preferably, the input device 940 may include a matrix of contact pads that detects the identity of the customizable button. An output device 950 may include one or more indicator lights, a buzzer, a speaker, a small display for displaying textual information. A power source 960 may include a battery or an external power source such as a DC adapter powered or powered by media device 130 in FIG. 1 via suitably wired means.

The platform 900 includes a transceiver 930 configured to be communicatively coupled to other device, system or network directly or indirectly. The transceiver 930 may be adapted to communicate with the media device 110 and/or the display device 120 in FIG. 1 to provide remote control functionality, to exchange information and/or to receive upgrade data. The transceiver 930 is capable of data communications using any suitable wired or a variety of custom or standard wireless protocols for example infrared (IR) and radio frequency (RF) such as IEEE 802.15.4, Wi-Fi, ZigBee, Bluetooth Low Energy, etc., or any other suitable communication protocol, including communication protocols not yet developed as of the filing date of this invention.

The processor 910 may be controllable by software or control logic. The software may include routines, programs, objects, components, and/or data structures, etc., that perform particular tasks or applications. The memory system 920 may include executable instructions and software that are intended to be executed by the processor 910. Memory system 920 may include a command code library for the purpose of controlling the operation of an appliance such as media device 130, display device 120, or appliances of different makes, models, and types. In addition, memory system 920 may include a correlation data table or database of all identification values together with the corresponding functions for the customizable keys. Preferably, the command code library and the correlation database may be stored in a non-volatile read/write memory of the memory system 920. The command code library and/or correlation database may be upgraded when upgrade data is received by transceiver 930. Correlation database may be upgraded to include new functions or features being added by media system provider in the middle of a product life cycle, introduction of new streaming content service or removal of obsolete content service, presence of little-used features which are important to only a very small subset of users, etc.

Figure 10:
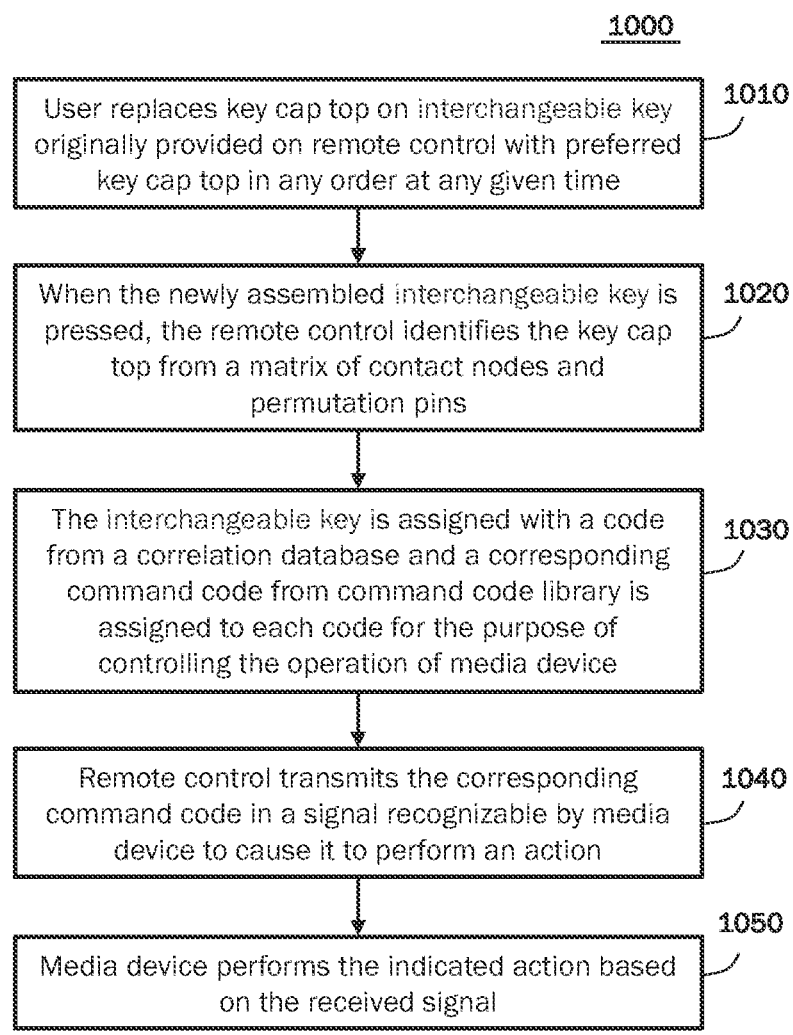
FIG. 10 is a flowchart of the operation of a handheld device with interchangeable keys according to the embodiments.

FIG. 10 is a flowchart of the operation of a handheld device with interchangeable keys according to the embodiments. In a preferred embodiment, the device is a remote control device provided by a media system provider that features fixed keys and a plurality of interchangeable keys. These interchangeable keys may be pre-labelled to launch streaming content service applications directly on the media system (see also FIG. 1).

A user may want to change the arrangement of the interchangeable keys or replace them with new key cap tops. The user may acquire one or more new interchangeable key cap tops that were not originally provided from the media system provider. For example, the key cap top may be provided when a user acquires the media system, the key cap top may be delivered to the user when the user subscribes to a new content service, the user may buy from a third party, or the media system provider may deliver to the user to encourage the user to use new content services or new functions or to promote special or commemorative events such as Olympic Games, FIFA World Cup, etc.

In step 1010, a user replaces one or more key cap tops originally provided on the remote control device with a preferred key cap top in any order at any given time.

In step 1020, when a newly assembled interchangeable key is pressed by the user, the identity of the key is configured to be detected by a matrix of contact nodes and permutation pins. The ON/OFF state of the contact node is being manipulated by the permutation pins and is then communicated to the remote control device, referring to the example of FIG. 7. Thus, the function and feature of each key on the panel are identified each time a user presses the interchangeable key. Optionally, the newly assembled interchangeable key may be pressed for a fixed period of time and released when prompted to by an output indicator of the remote control device, for example, indicator lights or a buzzer. This allows the remote control device to perform a setup to recognize the identity of the newly assembled interchangeable key at a first instance such that the identification process need not be repeated when the interchangeable key is pressed in future instances.

In step 1030, a unique code is configured to be assigned to represent each interchangeable key. Each code may include a corresponding information and functions of the unique key cap top and is configured to be stored in a correlation database in the remote control device, referring to the example of FIG. A command code library may also be provided in the remote control device and a corresponding command code may be assigned to each unique code for the purpose of controlling the operation of an appliance. For example, a command code to launch corresponding streaming content service application or to activate new function on the media device 130 in FIG. 1. In some embodiments, the correlation database may be provided in media device 130.

In step 1040, the remote control device transmits the corresponding command code in a signal recognizable by the media device to cause the media device to perform an action, for example, the media device to launch a streaming content service application. In some embodiments, the remote control device may transmit the unique code corresponding to the key in a signal recognizable by media device. The media device may then identify the received code and corresponding function and feature from the correlation database stored in the media device.

In step 1050, the media device performs the indicated action based on received signal, for example sending a command to the network to request content from content server of the corresponding content service provider.

It will now be apparent that a keyboard assembly with interchangeable keys has been described in the specification with sufficient particularity to be understood by one of ordinary skill in the art. Moreover, it will be apparent to those skilled in the art that various modifications, variations, substitutions, and equivalents exist for features of the device which do not materially depart from the scope of the invention.

It should be further appreciated by the person skilled in the art that variations and combinations of features described above, not being alternatives or substitutes, may be combined to form yet further embodiments falling within the intended scope of the invention.

The invention claimed is:

1. A keyboard assembly for a handheld device, comprising:
    a housing having a first section and a second section;
    a plurality of slots formed on the first section;
    a printed circuit board (PCB) disposed between the first and second sections;
    a key mat sandwiched between the first section and the PCB, the key mat having a plurality of fixed keys and a plurality of interchangeable keys, each key protruding from a corresponding slot on the first section, wherein each of the interchangeable keys comprises a key cover and a key base,
    wherein the plurality of interchangeable keys, each has a plurality of pins extending from each interchangeable key towards the PCB configured to provide each interchangeable key with a unique identity, such that when each interchangeable key is replaced onto another slot on the first section, the unique identity remains with the interchangeable key, and wherein the plurality of pins are configured to be selectively coated with a conductive material.

2. The keyboard assembly of claim 1, wherein the key mat comprises a plurality of adapters, each adapter being sized and shaped to receive a corresponding interchangeable key.

3. The keyboard assembly of claim 1, wherein the key cover has a plurality of key cover pins extending from a lower surface of the key cover.

4. The keyboard assembly of claim 3, wherein the key base has a plurality of sleeves extending from a lower surface of the key base, each of the sleeves having a sleeve hole therein and adapted to receive corresponding key cover pins.

5. The keyboard assembly of claim 4, wherein the sleeves are selectively coated with conductive print to identify each interchangeable key.

6. The keyboard assembly of claim 5, further comprising a plurality of contact nodes disposed on the PCB and aligned under a base of each sleeve, the sleeves being configured to contact the plurality of contact nodes when the interchangeable key is pressed.

7. The keyboard assembly of claim 6, wherein an arrangement of the contact nodes and an arrangement of input ports of a microcontroller are independent of a number of the plurality interchangeable keys.

8. The keyboard assembly of claim 4, wherein the key mat has a protrusion formed on a lower side of the key mat at a location of the interchangeable key, the protrusion being configured to abut a dome shaped element disposed on the PCB, when the interchangeable key is actuated by a user.

9. The keyboard assembly of claim 8, further comprising a plurality of contact nodes disposed on the PCB and aligned under a base of each sleeve, wherein each sleeve is configured to contact the plurality of contact nodes when the interchangeable key is pressed; and wherein the plurality of contact nodes is under the dome shaped element.

10. The keyboard assembly of claim 4, wherein each key cover pin is arranged such that there is a gap between a tip of each key cover pin and a base of the sleeve.

11. The keyboard assembly of claim 1, wherein the key cover has a slit at an edge of the key cover.

12. A handheld device comprising the keyboard assembly of claim 1.

13. A method of operating the handheld device of claim 12, comprising the steps of:
    (i) replacing an interchangeable key with another preferred interchangeable key on the handheld device to form a newly assembled interchangeable key;
    (ii) pressing the newly assembled interchangeable key, such that a unique identity of the interchangeable key is detected by a combination of a plurality of contact nodes and pins;
    (iii) assigning a code from a correlation database to the newly assembled interchangeable key;
    (iv) assigning a corresponding command code from a command code library to each code; and
    (v) transmitting the command code to a media device.

14. The method of claim 13, wherein the newly assembled interchangeable key is pressed for a fixed period of time and released when prompted to by an output indicator of the handheld device.

* * * * *